United States Patent
An

(10) Patent No.: US 6,451,649 B2
(45) Date of Patent: Sep. 17, 2002

(54) METHOD FOR FABRICATING SEMICONDUCTOR DEVICE HAVING A CAPACITOR

(75) Inventor: Jun Kwon An, Kyoungki-do (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/751,842

(22) Filed: Jan. 2, 2001

(30) Foreign Application Priority Data

Dec. 31, 1999 (KR) ............................................. 99-67978

(51) Int. Cl.⁷ .......................................... H01L 21/8242
(52) U.S. Cl. ........................ 438/253; 438/396; 438/672
(58) Field of Search ................................ 438/238–240, 438/253–256, 381, 396–399, 672, 675, 629

(56) References Cited

U.S. PATENT DOCUMENTS

| | | | |
|---|---|---|---|
| 5,891,762 A | | 4/1999 | Sakai et al. |
| 6,015,733 A | * | 1/2000 | Lee et al. .................... 438/253 |
| 6,015,734 A | * | 1/2000 | Huang et al. ............... 438/253 |

FOREIGN PATENT DOCUMENTS

| | | |
|---|---|---|
| JP | 9-51038 | 2/1997 |
| JP | 10-189898 | 7/1998 |

* cited by examiner

*Primary Examiner*—Jey Tsai
(74) *Attorney, Agent, or Firm*—Pillsbury Winthrop LLP

(57) ABSTRACT

Method for fabricating a semiconductor device including the steps of forming an interlayer insulating film, an etch stopper film, and a PE-TEOS film on a semiconductor substrate having an lower side structure formed thereon, by using a contact mask as an etch mask for exposing a portion to be a contact, etching the PE-TEOS film, the etch stopper film, and the interlayer insulating film, to form a contact hole, forming a polysilicon layer for a plug on an entire surface, and etched back, to stuff the contact hole, forming a core oxide film pattern on an entire surface to expose a portion to be a storage electrode, removing the polysilicon layer for a plug stuffed in the storage electrode contact hole by using an etch selectivity of the core oxide film pattern and the PE-TEOS film over the polysilicon layer for plug, to form a recess, to form a wedge type storage electrode contact plug left only in a portion of the interlayer insulating film in the storage electrode contact hole with a collapsed upper portion, and forming a cylindrical storage electrode in contact with the storage electrode contact plug through the recess, thereby increasing a cylinder area of the capacitor to enhance a cell refresh characteristics, securing a cell structural stability and prevent lifting of the cell capacitor during removal of the core oxide film as the capacitor is formed in a wedge type cylindrical structure, and simplifying the fabrication process as the CMP, which is one of the most difficult problems in the related art process, process can be reduced.

6 Claims, 14 Drawing Sheets

METHOD FOR FABRICATING SEMICONDUCTOR DEVICE HAVING A CAPACITOR

BACKGROUND OF THE INVENTION

1. Field of the Invention

The present invention relates to a method for fabricating a semiconductor device and more particularly, to a method for fabricating a semiconductor device, using an improved process for forming a contact plug in connection with the formation of a bitline or a capacitor in the semiconductor device provide a more stable bitline or capacitor structure.

2. Background of the Related Art

A first prior art method for fabricating a semiconductor device will be explained with reference to FIGS. 1A and 1B.

Referring to FIG. 1A, an interlayer insulating film 4 of BPSG (borophosphosilicate glass) is formed on a semiconductor substrate 1 having a bitline and a wordline formed thereon, and planarized by CMP (Chemical Mechanical Polishing). Then, a PE-TEOS (Plasma Enhanced tetra-ethyl ortho silicate glass) film 5 is plasma deposited on the interlayer insulating film 4, and an etch stopper film 6 is deposited thereon. Next, by using a storage electrode contact mask (not shown) as an etch mask to expose the portion of the structure to be used as a storage electrode contact to the semiconductor substrate 1, the etch stopper film 6, the PE-TEOS film 5, and the interlayer insulating film 4 are etched, to form a storage electrode contact hole 7. Then, a polysilicon layer (not shown) for forming a contact plug is deposited on an entire exposed surface, including the storage electrode contact hole 7, and etched back until the surface of the etch stopper film 6 is exposed, to form a contact plug 8. Then, a core oxide film (not shown) is formed over the entire surface. By using a storage electrode mask (not shown) as an etch mask for exposing a portion to be used as a storage electrode, the core oxide film is etched to form a core oxide film pattern 9 which exposes the contact plug 8. Then, a polysilicon layer 10a for forming a storage electrode is formed on the entire surface, and subjected to a CMP process to remove the upper portion of the layer to form a cylindrical storage electrode 10b.

This prior art method for fabricating a semiconductor device is, however, subject to problems caused by lifting as a result of the small contact area between the contact plug and the cylindrical storage electrode, or the collapse of the capacitor owing to the burden from the height of the capacitor. Further, etch residue at the boundary of the contact plug remaining from the etch back of the contact plug also increases contact resistance.

In order to address the problems of this prior art method, an alternative prior art method has been suggested.

Referring to FIG. 2A, an interlayer insulating film 14 of BPSG or the like is formed on a semiconductor substrate 11 having a bitline and a wordline formed thereon, and planarized by CMP. Then, nitride etch stopper film 15 is deposited on the planarized interlayer insulating film, and a PE-TEOS film 16 is plasma deposited thereon. By using a storage electrode contact mask (not shown) as an etch mask, the PE-TEOS film 16, the etch stopper film 15, and the interlayer insulating film 14 are etched in succession, to form a storage electrode contact hole 17. Then, a polysilicon layer (not shown) for forming the contact plug is deposited on the entire exposed surface including the storage electrode contact hole 17, and etched back until the surface of the PE-TEOS film 16 is exposed, to form a contact plug 18.

Next, a core oxide film (not shown) is formed on the entire surface, and, using a storage electrode mask as an etch mask for exposing the portion of the structure that will be used as a storage electrode, the core oxide film is etched, to form a core oxide film pattern 19. In this instance, a portion of the PE-TEOS film 16 is removed during the formation of the core oxide film pattern 19, allowing a portion of the contact plug 18 project above the remaining PE-TEOS film 6. Then, a polysilicon layer 20a for forming a storage electrode is formed on the entire exposed surface and the upper portion of the polysilicon layer 20a is then removed by CMP, to form a cylindrical storage electrode 20b.

Thus, is alternative prior art method may form a more stable structure than produced by the first prior art method. However, the problem of etch residue at the boundary of the contact plug has remained and, there have been problems associated with the structure. One structural problem is that the plug tends to break the H-beam form, a problem that becomes worse following a MPS (meta-stable silicate glass) process. This problem could be addressed somewhat by reducing the burden caused by the capacitor height to achieve the required structural improvement. But the trend is that capacitor heights are increasing to increase capacitance improve refresh performance, making it apparent that structural improvement can not be a fundamental or lasting solution to this problem.

FIG. 3 illustrates a second alternative prior art method for fabricating a semiconductor device, wherein a method for forming a bitline is shown.

Referring to FIG. 3, a first interlayer insulating film 24 of BPSG or the like is formed on a semiconductor substrate 21 having a wordline formed thereon, and a etch stopper film 25 is plasma deposited on the first interlayer insulating film 24. A PE-TEOS film 26 is formed on the etch stopper film 25. Next, using a bitline contact mask (not shown) as an etch mask to expose the portion of the structure that will be a bitline contact, the PE-TEOS film 26, the etch stopper film 25, and the first interlayer insulating film 24 are selectively removed, to form a first bitline contact hole 27. Next, a first polysilicon layer (not shown) is deposited on an entire surface including the first bitline contact hole 27, and etched back, to form a first contact plug 28. Then, a second interlayer insulating film 29 is formed on an entire exposed surface, and, using a bitline contact mask (not shown) as an etch mask for exposing the portion of the structure that will be a bitline contact in the first contact plug 28, the second interlayer insulating film 29 is etched, to form a second bitline contact hole 31. A second polysilicon layer (not shown) is then formed on the entire exposed surface including the second bitline contact hole 31, and etched back, to form a second contact plug 30 in contact with the first contact plug 28. Next, a third polysilicon layer (not shown) is formed on an entire exposed surface, and selectively removed, to form a bitline 32 in contact with the second contact plug 30.

Thus, in the second alternative prior art method, the first contact plug can provide a stable support to the second contact plug unless the height of the second contact plug is elongated unavoidably, resulting in lifting of the second plug, or shifting of the bitline.

SUMMARY OF THE INVENTION

Accordingly, the present invention is directed to a method for fabricating a semiconductor device that substantially overcomes one or more of the problems resulting from the limitations and disadvantages of the prior art methods.

An object of the present invention is to provide a method for forming a contact in a semiconductor device then can provide a secure and stable cell structure that will prevent lifting of a cell capacitor in a dip out of a core oxide film, and increase cylindrical area of the capacitor to improve self refresh characteristics.

Another object of the present invention is to provide a method for forming a contact in a semiconductor device, which can reduce the etch back process, which is one of the most difficult processes in the present fabrication processes, to thereby simplify the fabrication process.

Still another object of the present invention is to provide a method for forming a contact in a semiconductor device, which can reduce the resistance caused by residual material from the etch back used in forming the contact plug.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for fabricating a semiconductor device includes the steps of (1) forming an interlayer insulating film, an etch stopper film, and a PE-TEOS film in succession on a semiconductor substrate having a wordline and a bitline formed thereon, (2) by using a storage electrode contact mask as an etch mask, etching the PE-TEOS film, the etch stopper film, and the interlayer insulating film, to form a storage electrode contact hole, (3) forming a polysilicon layer for a contact plug on an entire surface, and etched back, to form a storage electrode contact plug stuffing the storage electrode contact hole, (4) forming a core oxide film pattern on an entire surface to expose a portion to be a storage electrode, (5) removing the storage electrode contact plug to a desired depth by using an etch selectivity of the core oxide film pattern and the PE-TEOS film over the storage contact plug, to form a recess, and (6) forming a cylindrical storage electrode in contact with the storage electrode contact plug through the recess.

In another aspect of the present invention, there is provided a method for fabricating a semiconductor device, including the steps of (1) forming an interlayer insulating film, an etch stopper film, and a PE-TEOS film in succession on a semiconductor substrate having a wordline and a bitline formed thereon, (2) by using a storage electrode contact mask as an etch mask, etching the PE-TEOS film, the etch stopper film, and the interlayer insulating film, to form a storage electrode contact hole, (3) forming a polysilicon layer for a contact plug on an entire surface, (4) etching back the polysilicon layer for a contact plug, to form a recess of a required depth in the storage electrode contact hole and, at the same time, to form a storage electrode contact plug stuffing an interlayer insulating film portion of the storage electrode contact hole, (5) forming a core oxide film pattern on an entire surface to expose a portion to be a storage electrode, and (6) forming a cylindrical storage electrode in contact with the storage electrode contact plug through the recess.

In further aspect of the present invention, there is provided a method for fabricating a semiconductor device, including the steps of (1) forming a first interlayer insulating film, an etch stopper film, and a PE-TEOS film on a semiconductor substrate having a wordline formed thereon, (2) by using a bitline contact mask as an etch mask, etching the PE-TEOS film, the etch stopper film, and the first interlayer insulating film, to form a first bitline contact hole, (3) forming a first polysilicon layer on an entire surface, (4) etching back the first polysilicon layer, to form a first bitline contact plug, wherein a portion above the first bitline contact plug is etched by a required thickness to form recess that exposes a portion larger than the first bitline contact hole, (5) forming on the entire surface a second interlayer insulating film having a second bitline contact hole exposing the first bitline contact plug, (6) forming on the entire surface, and then etching back a second polysilicon layer, to form a second bitline contact plug in contact with the first bitline contact plug, and (7) forming a bitline in contact with the second bitline contact plug.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments of the present invention, examples of which are illustrated in the accompanying drawings. A method for fabricating a semiconductor device in accordance with a first preferred embodiment of the present invention will be explained, with reference to FIGS. 4A~4C.

Figure 1A:
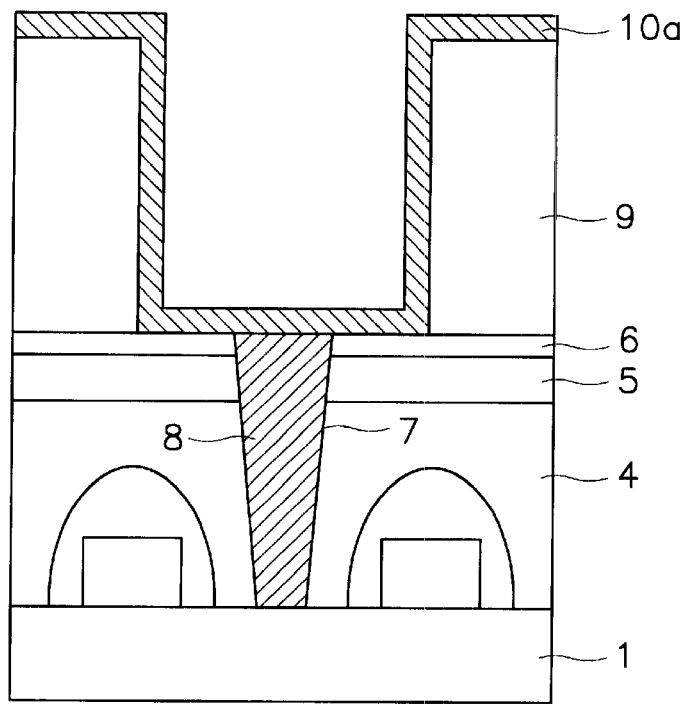
FIGS. 1A and 1B are sectional views illustrating the steps of a prior art method for fabricating a semiconductor device.
Figure 1B:
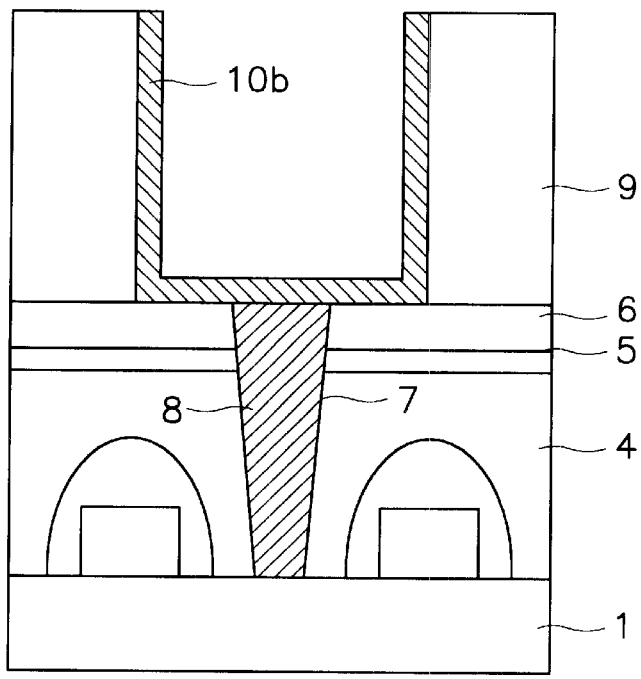
Figure 2A:
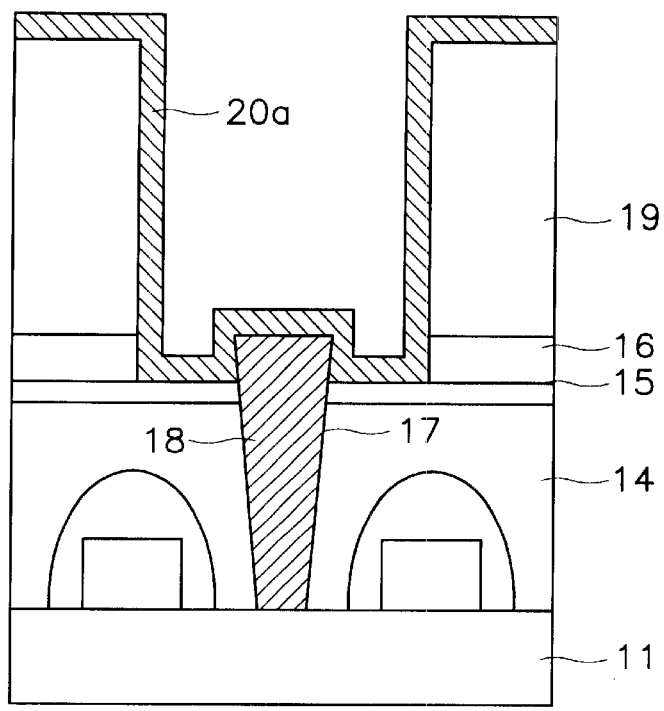
FIGS. 2A and 2B are sectional views illustrating the steps of a first alternative prior art method for fabricating a semiconductor device.
Figure 2B:
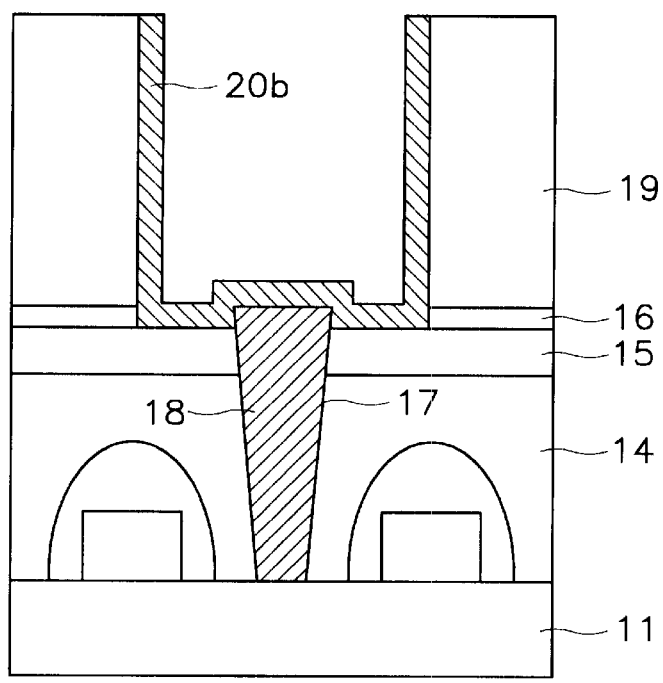
Figure 3:
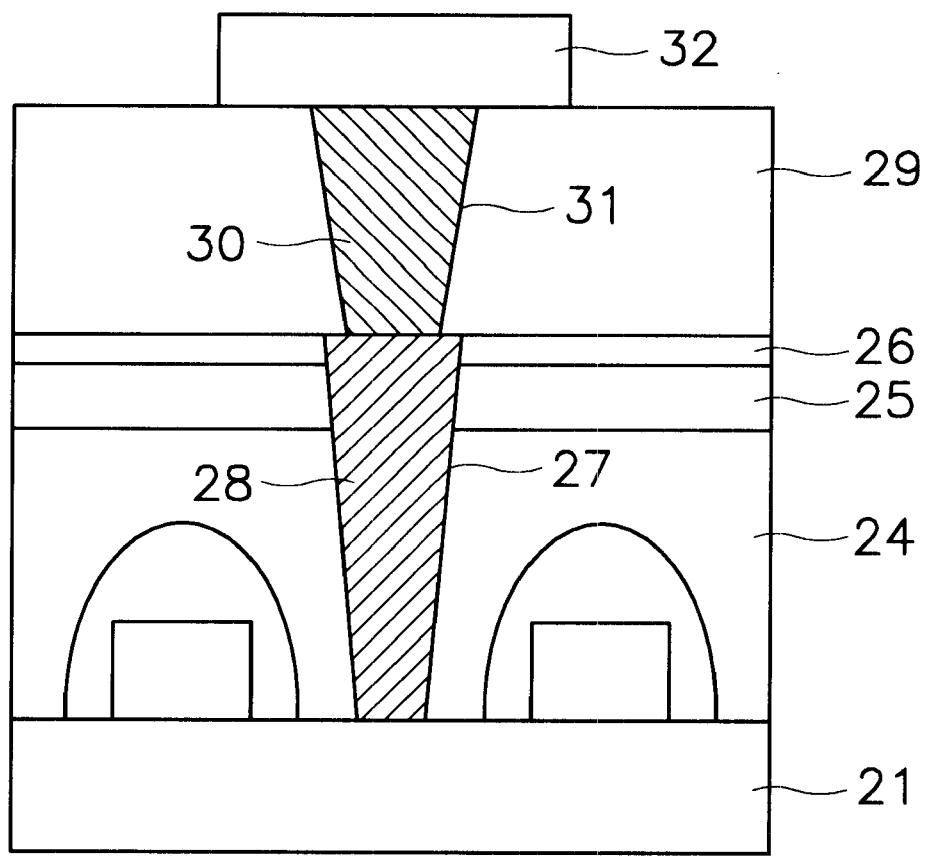
FIG. 3 is a sectional view illustrating a device formed by a second alternative prior art method for fabricating a semiconductor device.
Figure 4A:
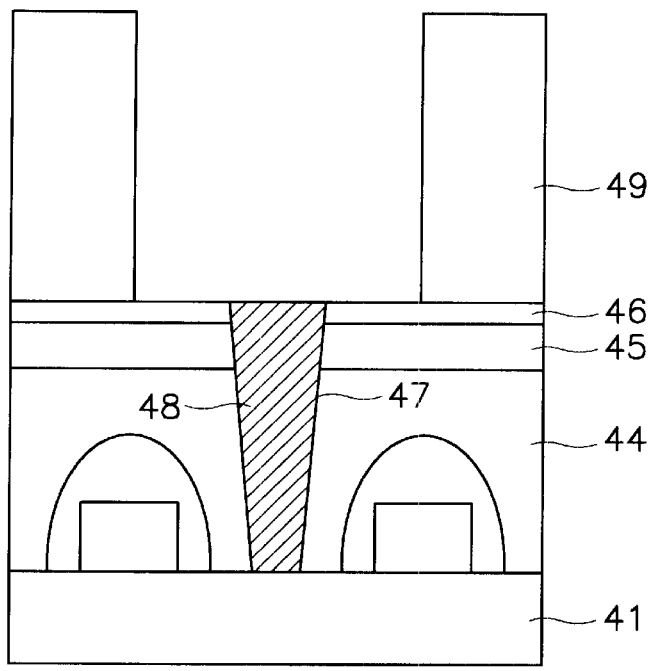
FIGS. 4A~4C are sectional views illustrating the steps of a method for fabricating a semiconductor device in accordance with a first preferred embodiment of the present invention.
Figure 4B:
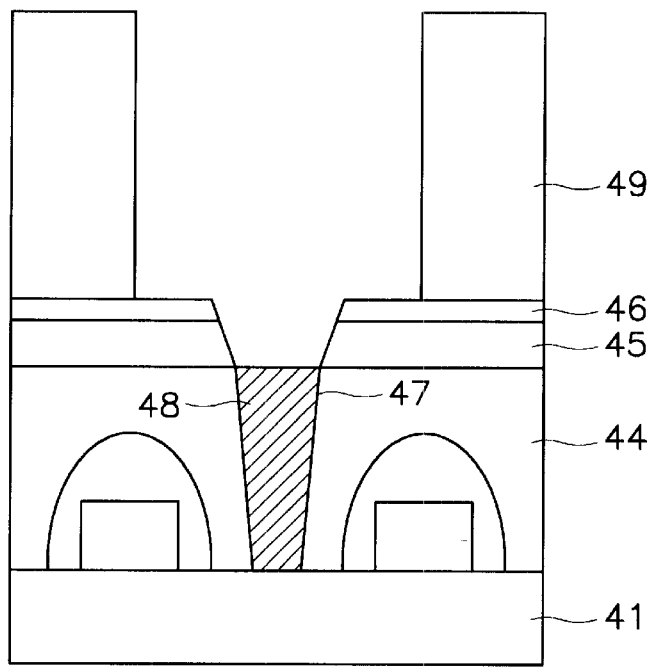
Figure 4C:
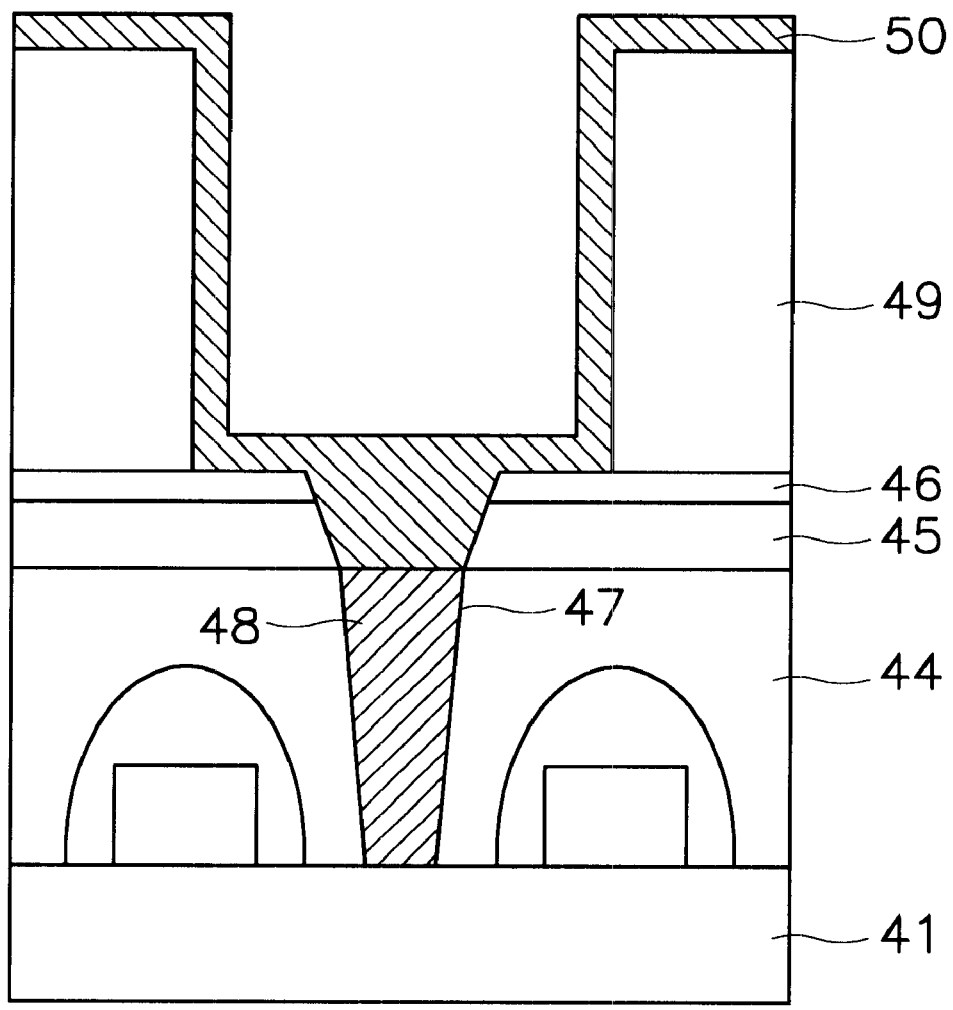

Referring to FIG. 4A, an interlayer insulating film 44 of BPSG or the like is formed on a semiconductor substrate 41 having a wordline and a bitline formed thereon, and planarized by CMP. Then, an etch stopper film 45 of a nitride is plasma deposited on the interlayer insulating film 44, and a PE-TEOS film 46 is formed thereon. Using a storage electrode contact mask (not shown) as an etch mask for exposing a portion of the surface intended to be a storage electrode contact, the PE-TEOS film 46, the etch stopper film 45, and the interlayer insulating film 44 are etched to form a storage electrode contact hole 47. A polysilicon layer (not shown) for a contact plug is deposited on an entire surface, including the storage electrode contact hole 47, and etched back to form a storage electrode contact plug 48. Then, a core oxide film (not shown) is formed over the entire surface. Next, using a storage electrode mask (not shown) as an etch mask for exposing a portion of the structure intended to be a storage electrode, the core oxide film is etched, to form a core oxide film pattern 49 which exposes the storage electrode contact plug 48. As shown in FIG. 4B, the storage electrode contact plug 48 is also removed to a desired depth by utilizing the etch selectivity of the core oxide film pattern 49 and the PE-TEOS film 46 over the storage contact plug 48, to form a recess. As shown in FIG. 4C, a polysilicon layer 50 for a storage electrode is formed on the entire exposed surface with the polysilicon layer 50 filling the recess to form a stable structure. The steps hereafter are conducted in much the same as the corresponding steps of the prior art methods, to complete the capacitor fabrication process.

A method for fabricating a semiconductor device in accordance with a second preferred embodiment of the present invention will be explained.

Figure 5:
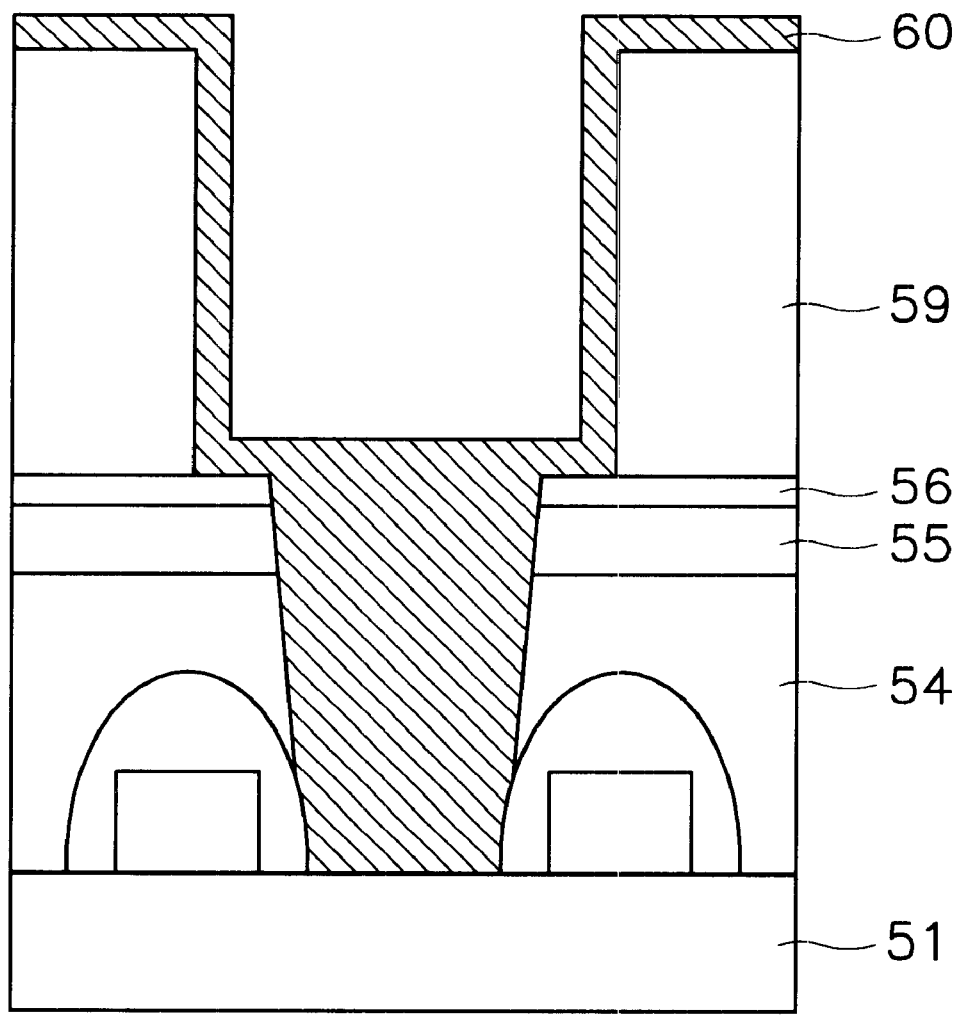
FIG. 5 is a sectional view illustrating a device formed by a method for fabricating a semiconductor device in accordance with a second preferred embodiment of the present invention.

The steps up to FIG. 4A in the first preferred embodiment of the present invention are made as describe above. Then, material filling the storage electrode contact hole is completely removed by using an etch selectivity of the core oxide film pattern 59 and the PE-TEOS film 56 over the fill material found in the storage electrode contact hole. In this instance, the portion of the storage electrode contact plug that is removed is increased. The material filling the storage electrode contact hole may be an insulating material, such as polysilicon, $Si_xO_y$, or TEOS. As shown in FIG. 5, a polysilicon layer 60 for a storage a electrode is then formed on the entire surface, to fill the storage electrode contact hole, deposit on the surfaces of the storage electrode contact hole and deposit on the core oxide film pattern 59. The steps hereafter are conducted in much the same manner as the corresponding steps of the prior art methods, to complete the capacitor fabrication process.

A method for fabricating a semiconductor device in accordance with a third preferred embodiment of the present invention will be explained.

Figure 6A:
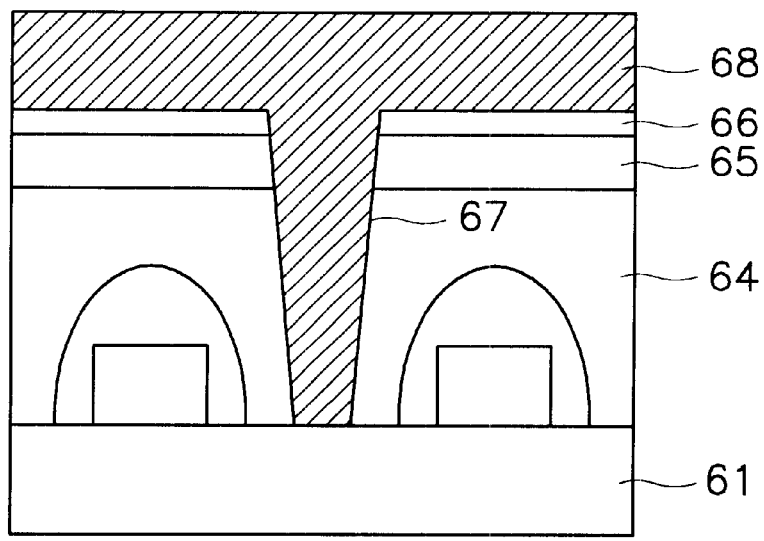
FIGS. 6A~6C are sectional views illustrating the steps of a method for fabricating a semiconductor device in accordance with a third preferred embodiment of the present invention.
Figure 6B:
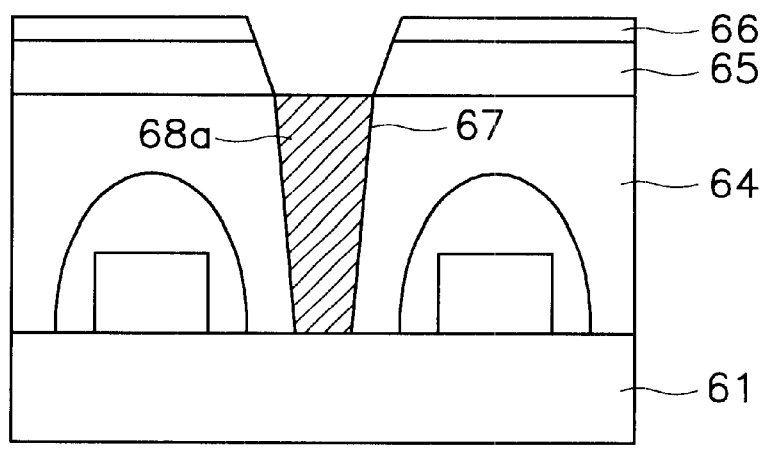
Figure 6C:
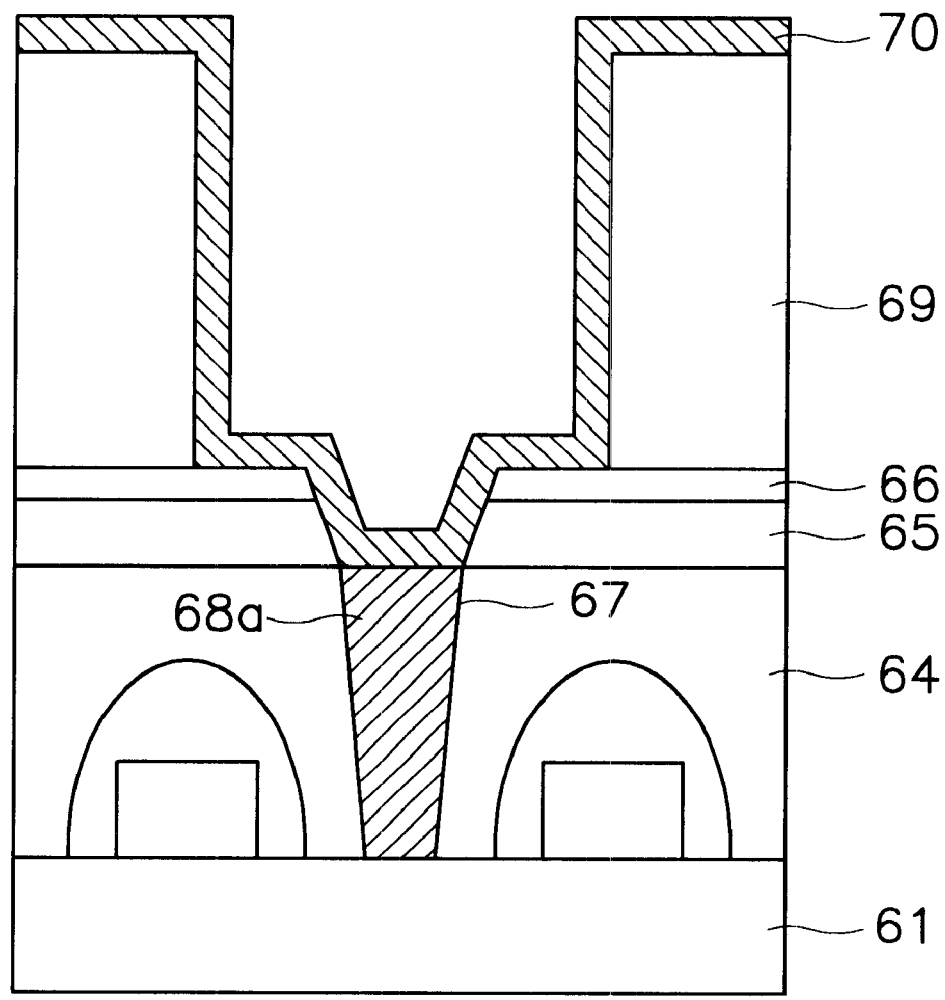

Referring to FIG. 6A, an interlayer insulating film 64 of BPSG or the like is formed on a semiconductor substrate 61 having a bitline and a wordline formed thereon, and planarized by CMP. Then, an etch stopper film 65 is plasma deposited on the interlayer insulating film 64, and a PE-TEOS film 66 is formed on the etch stopper film 65. Next, by using a storage electrode contact mask (not shown) as an etch mask, the PE-TEOS film 66, the etch stopper film 64, and the interlayer insulating film 64 are etched, for form a storage electrode contact hole 67. Then, a polysilicon layer 68 for storage electrode contact plug is formed on an entire surface inclusive of the storage electrode contact hole 67. As shown in FIG. 6B, the polysilicon layer 68 is dry or wet etched, to form a storage electrode contact plug 68a, with an upper portion of the storage electrode contact plug 68a being removed to a predetermined depth, to leave the storage electrode contact plug 68a only in the interlayer insulating film 64. It should be noted that the etch back or the CMP processes can be omitted in the formation of the storage electrode contact plug 68a, thereby simplifying the capacitor forming process. As shown in FIG. 6C, a core oxide film (not shown) is formed on the entire exposed surface and etched using a storage electrode mask as an etch mask for exposing a portion of the structure intended to be a storage electrode, to form a core oxide film pattern 69 which exposes the storage electrode contact plug 68a. Then, a polysilicon layer 70 for forming the storage electrode is formed on the entire exposed surface. The steps hereafter are conducted in much the same manner as the corresponding steps of the prior art methods.

A method for fabricating a semiconductor device in accordance with a fourth preferred embodiment of the present invention will be explained.

Figure 7A:
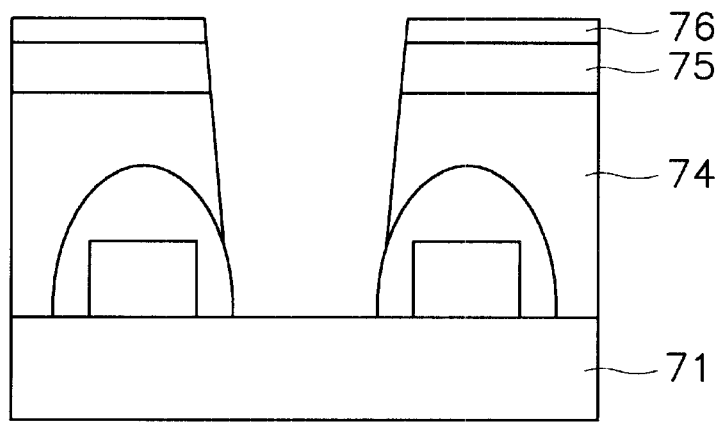
FIGS. 7A and 7B are sectional views illustrating showing the steps of a method for fabricating a semiconductor device in accordance with a fourth preferred embodiment of the present invention.
Figure 7B:
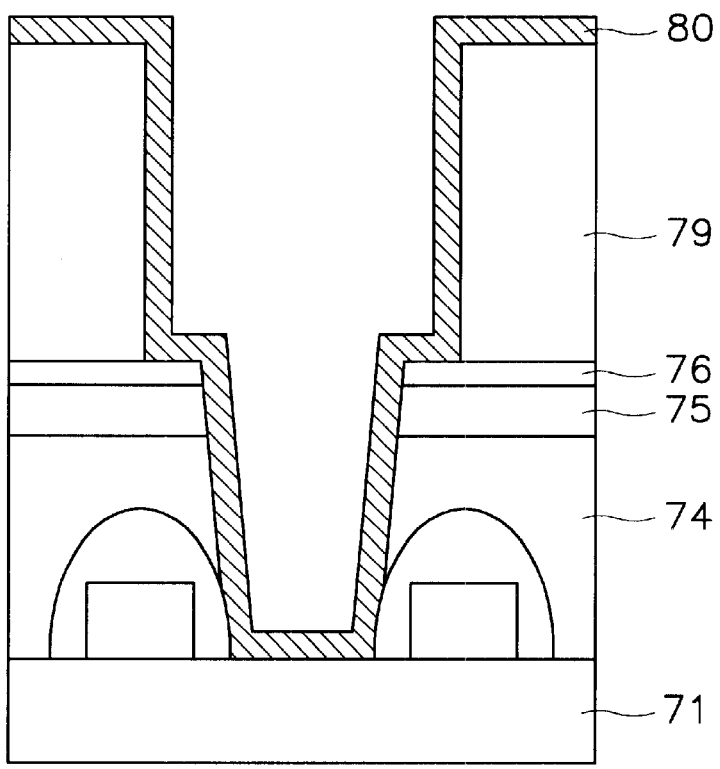

Referring to FIG. 7A, after conducting the same process used in the previous embodiments steps to form the structure shown in FIG. 4A, the storage electrode contact plug filling the storage electrode hole is completely removed. Although as described, the storage electrode contact plug is formed of polysilicon, the storage electrode contact plug may also be formed from an insulating material, such as $Si_xO_y$, or TEOS. As shown in FIG. 7B, a polysilicon layer 80 for a storage electrode is then formed on the entire surface, such that the polysilicon layer 80 does not fill the area from which the storage electrode contact plug has been removed. The process steps hereafter are conducted in much the same manner as the corresponding steps of the prior art methods to complete a capacitor forming process.

A method for fabricating a semiconductor device in accordance with a fifth preferred embodiment of the present invention will be explained.

Figure 8A:
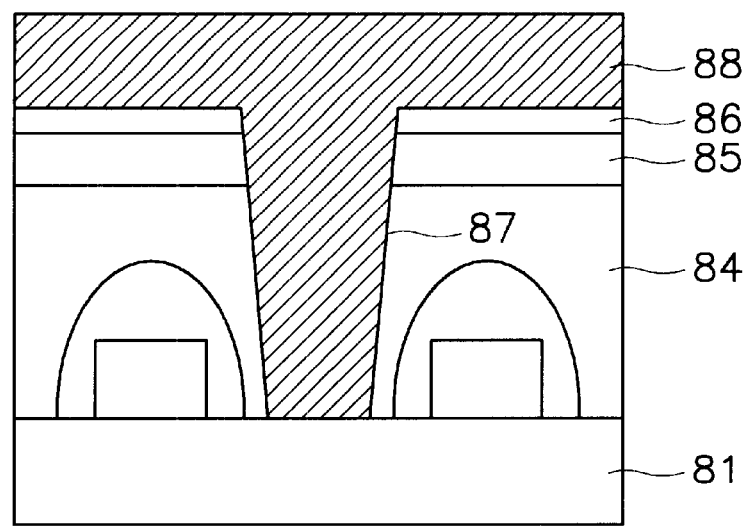
FIGS. 8A~8E are sectional views illustrating the steps of a method for fabricating a semiconductor device in accordance with a fifth preferred embodiment of the present invention; and, FIGS. 9A~9D are sectional views illustrating the steps of a method for fabricating a semiconductor device in accordance with a sixth preferred embodiment of the present invention.
Figure 8B:
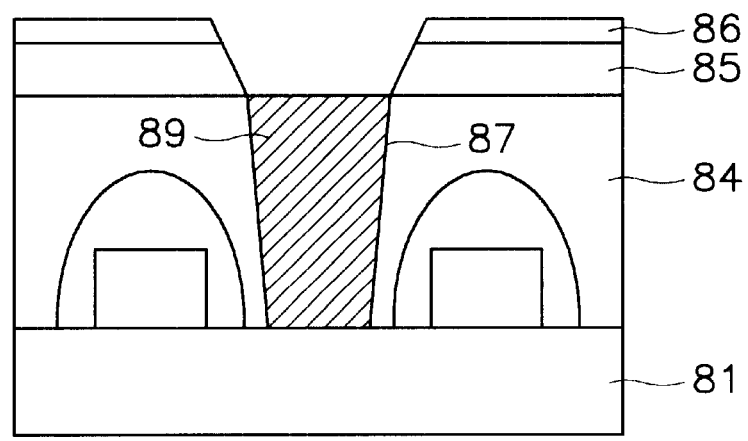
Figure 8C:
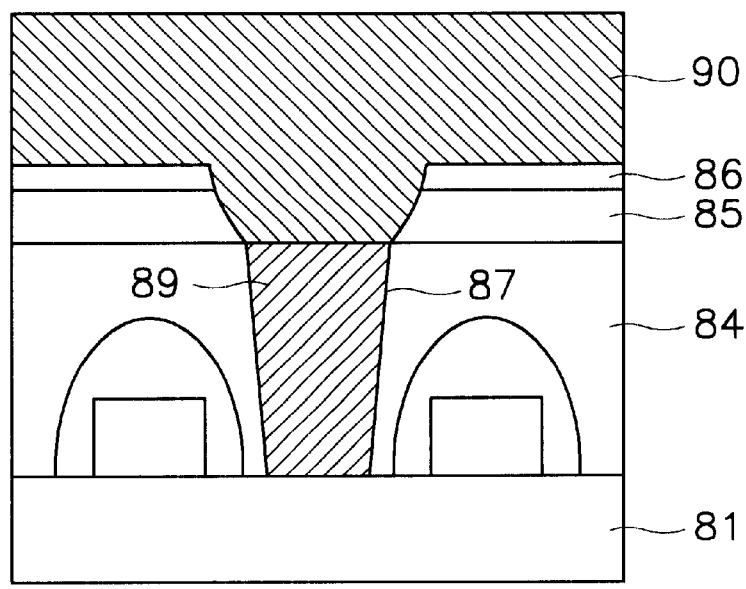
Figure 8D:
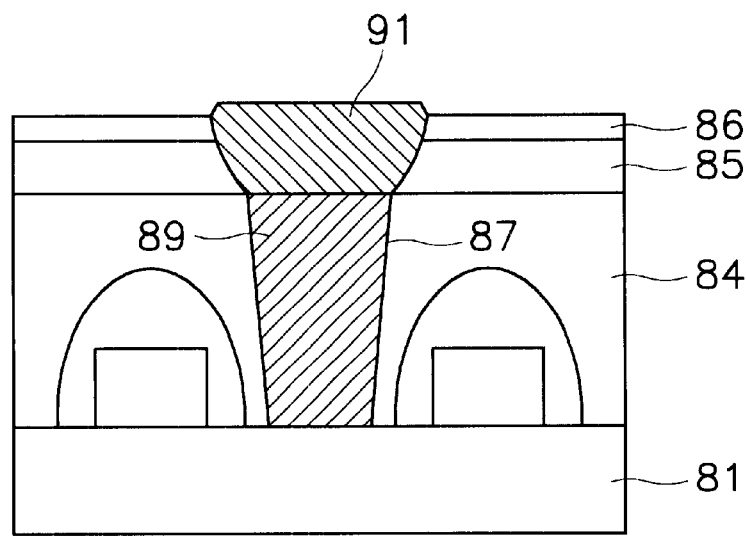
Figure 8E:
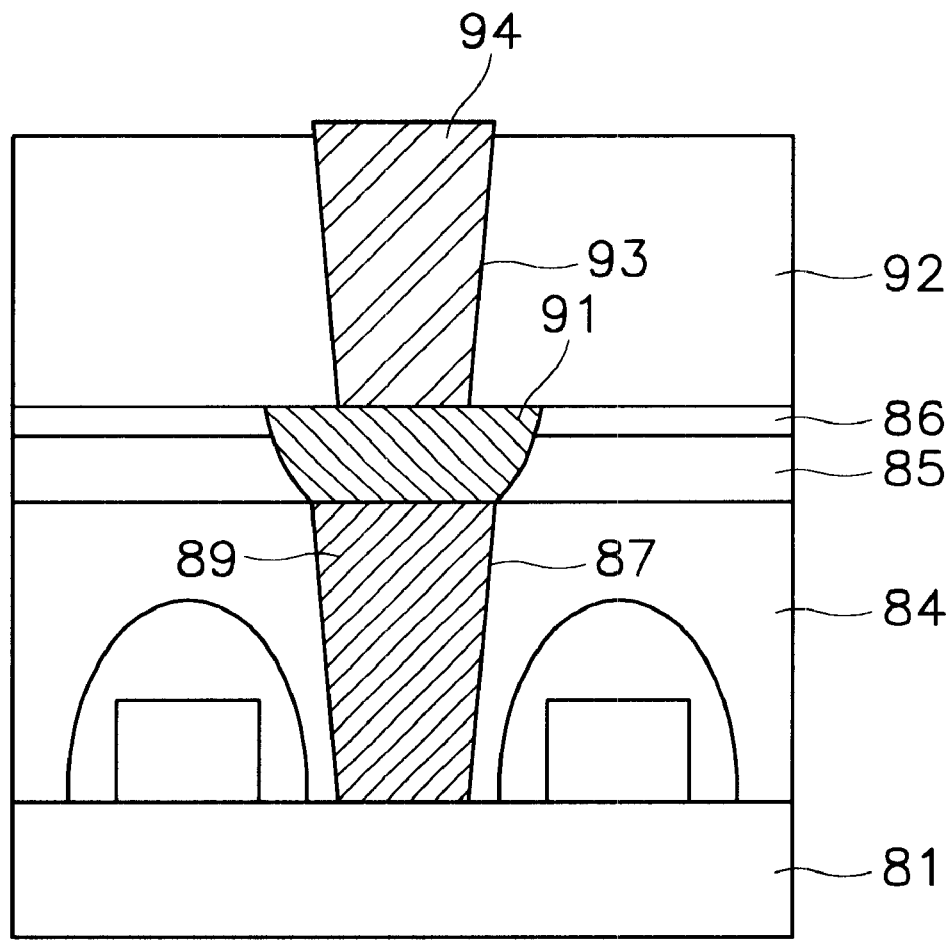

Referring to FIG. 8A, a first interlayer insulating film 84 of BPSG or the like is formed on a semiconductor substrate 81 having a bitline and a wordline formed thereon, and planarized by CMP. Then, an etch stopper film 85 is plasma deposited on the first interlayer insulating film 84, and a PE-TEOS film 86 is formed on the etch stopper film 85. Next, using a contact mask (not shown), the PE-TEOS film 86, the etch stopper film 85, and the first interlayer insulating film 84 are etched to form a first storage electrode contact hole 87. A first polysilicon layer 88 is then formed on the entire surface, including the first storage electrode contact hole 87. As shown in FIG. 8B, the first polysilicon layer 88 is selectively dry or wet etched to a level below the surface of the surrounding PE-TEOS film 86 and the etch stopper film 85, to form a first contact plug 89. As shown in FIG. 8C, a second polysilicon layer 90 is formed on the entire exposed surface. FIG. 8B illustrates a case of dry etch, and FIG. 8C illustrates a case of wet etch that results in an undercut. As shown in FIG. 8D, the second polysilicon layer 90 is etched back to the surface of the PE-TEOS film 86, to form a second contact plug 91. In this instance, since an upper surface area of the second contact plug 91 is larger than the first contact 89, the contact overlap allowance to the subsequently formed with a third contact plug is increased. As shown in FIG. 8E, a second interlayer insulating film 92 is formed on the entire surface, and etched using a contact mask (not shown) to form a second storage electrode contact hole 93. Next, a third polysilicon layer (not shown) is formed on the entire exposed surface inclusive of the second storage electrode contact hole 93 and etched back to form a third contact plug 94. Thus, the increased overlap allowance with the contact makes formation of a more stable capacitor possible. The process steps hereafter are conducted in much the same manner as the corresponding steps of the prior art methods.

A method for fabricating a semiconductor device in accordance with a sixth preferred embodiment of the present invention will be explained, which is related to a method for forming a bitline.

Figure 9A:
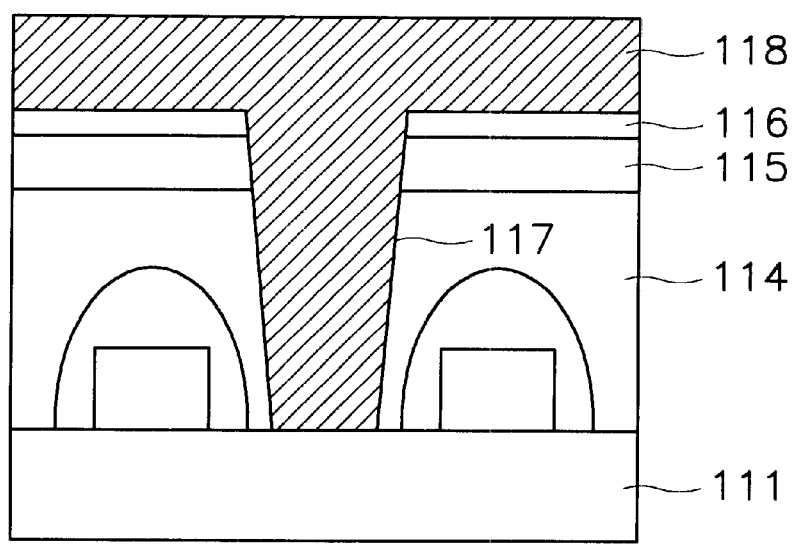
Figure 9B:
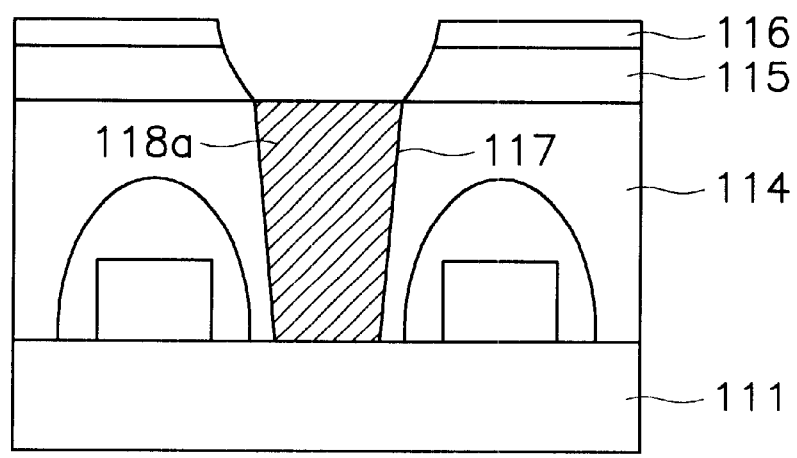
Figure 9C:
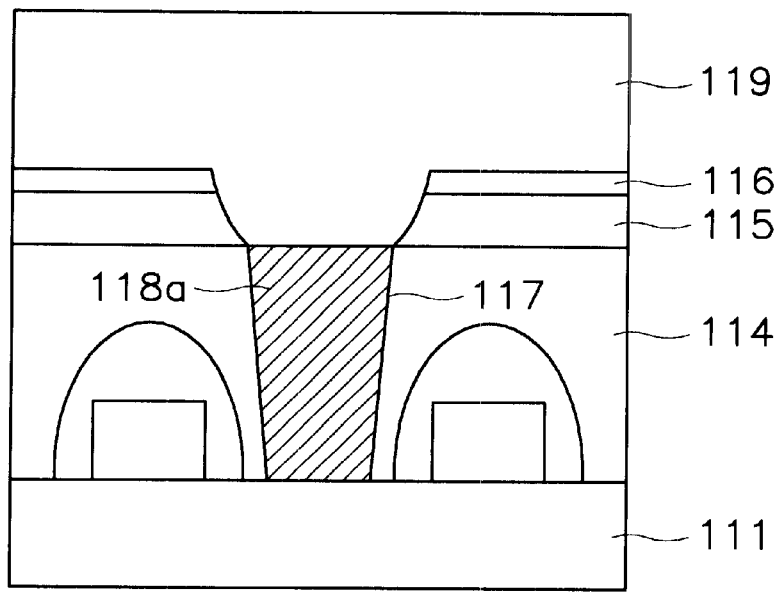
Figure 9D:
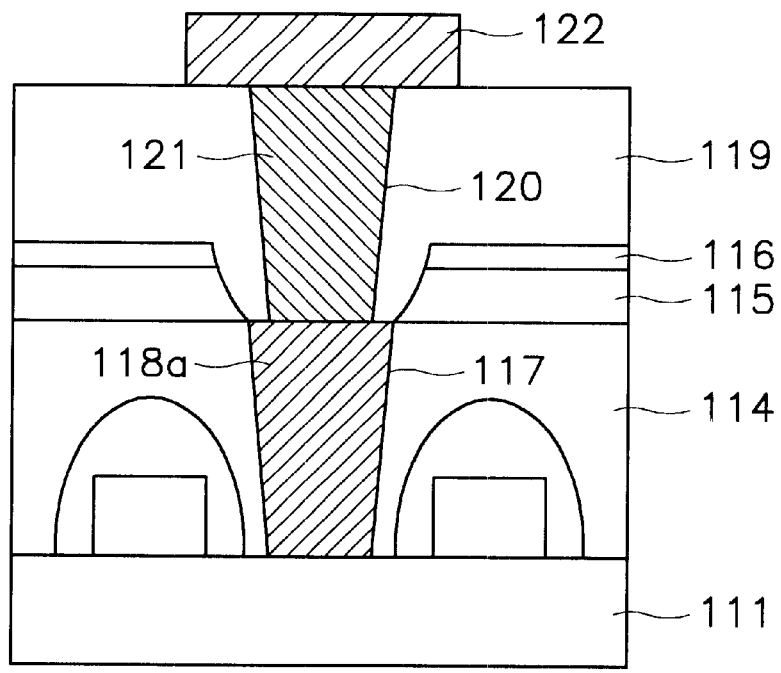

Referring to FIG. 9A, a first interlayer insulating film 114 of BPSG or the like is formed on a semiconductor substrate 111 having a bitline and a wordline formed thereon, and planarized by CMP. A etch stopper film 115 is then plasma deposited on the first interlayer insulating film 114, and a PE-TEOS film 116 is formed on the etch stopper film 115. Next, by using a bitline contact mask (not shown), the PE-TEOS film 116, the etch stopper film 115, and the first interlayer insulating film 114 are etched, to form a first bitline contact hole 117. Then, a first polysilicon layer 118 is formed on the entire surface, including the first bitline contact hole 87. As shown in FIG. 9B, the first polysilicon layer 118 is then selectively dry or wet etched down to a level below the surface of the PE-TEOS film 116 and the etch stopper film 115, to form a first bitline contact plug 118a. In this instance, FIG. 9B illustrates a case in which wet etching is conducted, in which portions of sidewalls of the PE-TEOS film 116 and the etch stopper film 115 are also etched, to cause undercuts, to form a slightly larger width. As shown in FIG. 9C, a second interlayer insulating film 119 is formed on the entire exposed surface, and as shown in FIG. 9D, removed using a bitline contact mask (not shown) as an etch mask to form a second bitline contact hole 120. Then, a second polysilicon layer is formed on the entire exposed surface, including the second bitline contact hole 120, and etched back to form a second bitline contact hole 121 in contact with the first bitline contact plug 118a. In this instance, a lower portion of the second bitline contact plug 121 is surrounded by the second interlayer insulating film 119, to facilitate a stable support for the bitline 122 that will be formed in a subsequent fabrication step. Then, a third polysilicon layer (not shown) is formed on the entire exposed surface and etched using a bitline mask as an etch mask, to form a bitline 122.

As explained, the method for fabricating a semiconductor device of the present invention has the following advantages.

By forming an interlayer insulating film, an etch stopper film, and a PE-TEOS film on a semiconductor substrate having an lower side structure formed thereon, by using a contact mask as an etch mask for exposing a portion to be a contact, etching the PE-TEOS film, the etch stopper film, and the interlayer insulating film, to form a contact hole, forming a polysilicon layer for a plug on an entire surface, and etched back, to fill the contact hole, forming a core oxide film pattern on an entire surface to expose a portion of the structure intended to be a storage electrode, removing the polysilicon layer for a plug formed in the storage electrode contact hole by using the etch selectivity of the core oxide film pattern and the PE-TEOS film over the polysilicon plug layer to form a recess, to form a wedge type storage electrode contact plug in only a portion of the interlayer insulating film in the storage electrode contact hole with a collapsed upper portion, and forming a cylindrical storage electrode in contact with the storage electrode contact plug through the recess, the method for fabricating a semiconductor device of the present invention can expand a cylinder area of the capacitor to enhance a cell refresh characteristics, secure a cell structural stability and prevent lifting of the cell capacitor during removal of the core oxide film as the capacitor is formed in a wedge type cylindrical structure, and simplifies the fabrication process as the CMP process, which is one of the most difficult operations in the prior art process, can be eliminated.

It will be apparent to those skilled in the art that various modifications and variations can be made in the method for fabricating a semiconductor device of the present invention without departing from the spirit or scope of the invention. Thus, it is intended that the present invention cover the modifications and variations of this invention provided they come within the scope of the appended claims and their equivalents.

What is claimed is:

1. A method of fabricating a semiconductor device, comprising:
   (1) forming an interlayer insulating film, an etch stopper film, and a PE-TEOS film in succession on a semiconductor substrate having a wordline and a bitline formed thereon;
   (2) etching the PE-TEOS film, the etch stopper film, and the interlayer insulating film using a storage electrode contact mask as an etch mask to form a storage electrode contact hole;
   (3) forming a layer of material for the storage electrode contact plug on the PE-TEOS film, wherein the layer of material extends into and fills the storage electrode contact hole;
   (4) etching back the layer of material for the storage electrode contact plug to form a storage electrode contact plug;
   (5) forming a core oxide film pattern exposing a predetermined area for the storage electrode;
   (6) removing at least a portion of the storage electrode contact plug and at least a portion of the PE-TEOS film by utilizing the differences of etch rate among the core oxide film pattern, the PE-TEOS film and the storage electrode contact plug, said removing enlarges the storage electrode contact hole; and
   (7) forming a cylindrical storage electrode which is in electrical contact with the semiconductor substrate.

2. The method according to claim 1, wherein in the step (6), the storage electrode contact plug is completely removed, whereby the upper portion of the storage electrode contact hole is larger than the lower portion thereof.

3. The method according to claim 2, wherein the step (7) comprises forming a polysilicon layer, the polysilicon layer being extended along the exposed surface of the semiconductor substrate in the storage electrode contact hole, a side wall of the storage electrode contact hole, and exposed surfaces of PE-TEOS film and the core oxide film pattern.

4. The method according to any one of claim 1, 2 or 3 wherein the layer of material for the storage electrode contact plug has an etch selectivity lower than the core oxide film and higher than polysilicon.

5. The method according to claim 4, wherein the layer of material for the storage electrode contact plug is an insulating material selected from a group consisting of $Si_xO_y$ and TEOS.

6. The method according to claim 2, wherein the step (7) comprises forming a polysilicon layer, the polysilicon layer being extended into the storage electrode contact hole, and along exposed surfaces of PE-TEOS film and the core oxide film pattern.

* * * * *